(12) United States Patent
Tu et al.

(10) Patent No.: US 10,845,698 B2
(45) Date of Patent: Nov. 24, 2020

(54) MASK, METHOD OF FORMING THE SAME AND METHOD OF MANUFACTURING A SEMICONDUCTOR DEVICE USING THE SAME

(71) Applicant: Taiwan Semiconductor Manufacturing Co., Ltd., Hsinchu (TW)

(72) Inventors: Chih-Chiang Tu, Tauyen (TW); Chun-Lang Chen, Tainan (TW); Shih-Hao Yang, Tainan (TW); Jheng-Yuan Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 162 days.

(21) Appl. No.: 15/992,203

(22) Filed: May 30, 2018

(65) Prior Publication Data

US 2019/0369484 A1    Dec. 5, 2019

(51) Int. Cl.
| | |
|---|---|
| *G03F 1/24* | (2012.01) |
| *G03F 1/26* | (2012.01) |
| *G03F 1/22* | (2012.01) |
| *G03F 1/52* | (2012.01) |
| *G03F 1/80* | (2012.01) |
| *H01L 21/033* | (2006.01) |
| *G03F 1/54* | (2012.01) |

(52) U.S. Cl.
CPC .................. *G03F 1/26* (2013.01); *G03F 1/22* (2013.01); *G03F 1/24* (2013.01); *G03F 1/52* (2013.01); *G03F 1/54* (2013.01); *G03F 1/80* (2013.01); *H01L 21/0337* (2013.01)

(58) Field of Classification Search
CPC ..... G03F 1/24; G03F 1/52; G03F 1/54; G03F 1/76
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,012,132 B2 | 4/2015 | Chang |
| 9,093,530 B2 | 4/2015 | Huang et al. |
| 9,028,915 B2 | 5/2015 | Chang et al. |
| 9,146,469 B2 | 9/2015 | Liu et al. |
| 9,184,054 B1 | 11/2015 | Huang et al. |
| 9,213,234 B2 | 12/2015 | Chang |
| 9,223,220 B2 | 12/2015 | Chang |

(Continued)

*Primary Examiner* — Daborah Chacko-Davis
(74) *Attorney, Agent, or Firm* — JCIPRNET (57) ABSTRACT

A mask, a method of forming the same and a method of manufacturing a semiconductor device using the same are disclosed. The mask includes a substrate, a reflective multilayer coating, an absorption layer and an absorption part. The substrate includes a mask image region and a mask frame region, wherein the mask frame region has a mask black border region adjacent to the mask image region. The reflective multilayer coating is disposed over the substrate. The absorption layer is disposed over the reflective multilayer coating. The absorption part is disposed in the reflective multilayer and the absorption layer in the mask black border region.

20 Claims, 7 Drawing Sheets

(56) References Cited

U.S. PATENT DOCUMENTS

| | | |
|---|---|---|
| 9,256,123 B2 | 2/2016 | Shih et al. |
| 9,256,133 B2 | 2/2016 | Chang |
| 9,529,268 B2 | 12/2016 | Chang et al. |
| 9,536,759 B2 | 1/2017 | Yang et al. |
| 9,548,303 B2 | 1/2017 | Lee et al. |
| 2014/0051015 A1* | 2/2014 | Gallagher ................ G03F 1/24 |
| | | 430/5 |
| 2017/0263444 A1* | 9/2017 | Shoki ....................... G03F 1/54 |

* cited by examiner

MASK, METHOD OF FORMING THE SAME AND METHOD OF MANUFACTURING A SEMICONDUCTOR DEVICE USING THE SAME

BACKGROUND

Photolithography is utilized in the fabrication of semiconductor devices to transfer a pattern onto a wafer. Based on various integrated circuit (IC) layouts, patterns are transferred from a photomask (or a reticles) to a surface of the wafer. As dimensions decrease and density in IC chips increases, resolution enhancement techniques, such as optical proximity correction (OPC), off-axis illumination (OAI), double dipole lithography (DDL) and phase-shift mask (PSM), are developed to improve depth of focus (DOF) and therefore to achieve a better pattern transfer onto the wafer.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 1A:
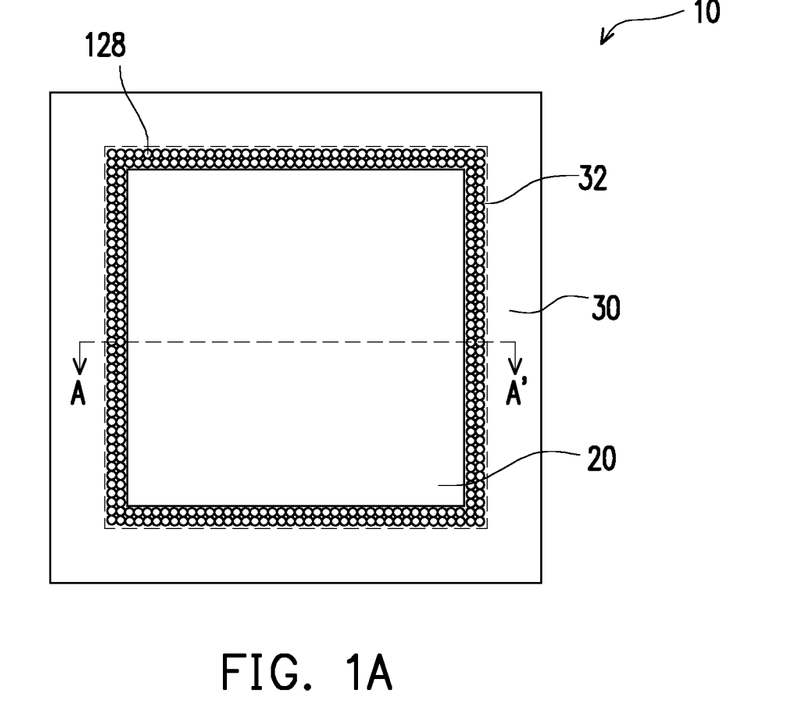
FIG. 1A is a top schematic view of a mask in accordance with some embodiments of the disclosure.
Figure 1B:
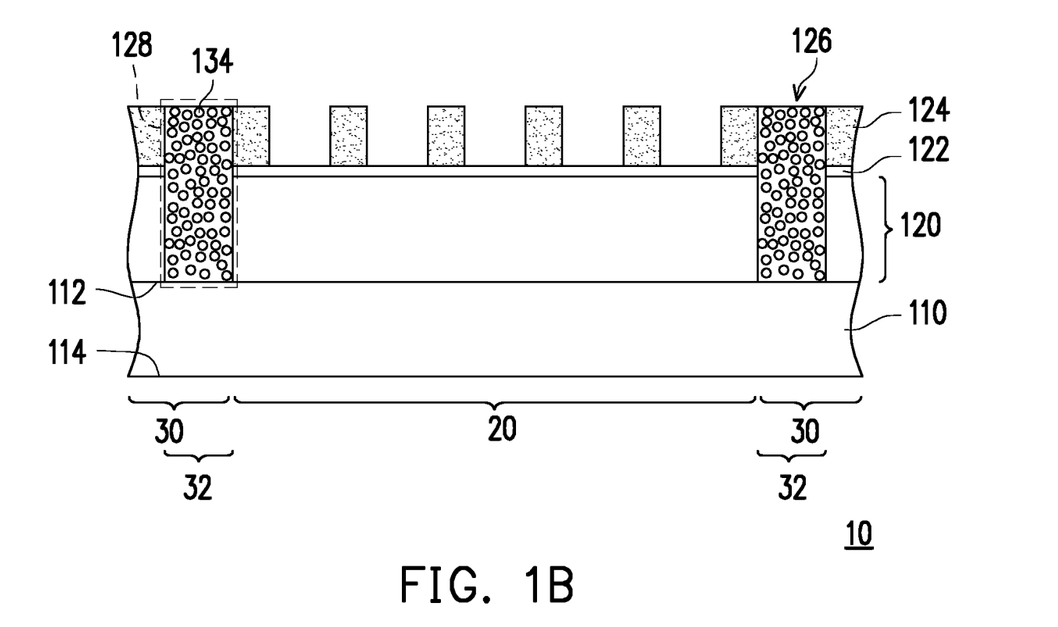
FIG. 1B is a schematic cross-sectional view of a mask in accordance with some embodiments of the disclosure.

FIG. 1A is a top schematic view of a mask in accordance with some embodiments of the disclosure, and FIG. 1B is a schematic cross-sectional view of a mask of FIG. 1A along the A-A' line in accordance with some embodiments of the disclosure. FIG. 1B has been simplified for the sake of clarity to better understand the inventive concepts of the present disclosure. Additional features can be added in the mask, and some of the features described below can be replaced or eliminated for additional embodiments of the mask.

Referring to FIGS. 1A and 1B, in some embodiments, a mask 10 is a reflective mask. In some embodiments, the mask 10 is configured to minimize reflectivity of light, particularly extreme ultraviolet (EUV) radiation (for example, EUV radiation having a wavelength of about 1 nm to about 10 nm, although other wavelengths of light (radiation) are contemplated by the present disclosure). In some embodiments, the mask 10 is a phase shift mask, such as an attenuated phase shift mask (AttPSM). Alternatively, the phase shift mask is an alternating phase shift mask (AltPSM). The mask 10 includes a mask image region 20 and a mask frame region 30. The mask image region 20 is an area of the mask 10 that includes a pattern (or design) of a layer of an integrated circuit device (or chip). For example, the mask 10 includes a pattern (or design) of a layer of a resistor, a capacitor, an inductor, a diode, a metal-oxide-semiconductor field effect transistor (MOSFET), a complementary MOS (CMOS) transistor, a bipolar junction transistor (BJT), a laterally diffused MOS (LDMOS) transistor, a high power MOS transistor, a fin-like field effect transistor (FinFET), other integrated circuit component, or combination thereof. The mask frame region 30 is an area of the mask 10 that does not include the pattern (or design) of the layer of the integrated circuit device (or chip). The mask frame region 30 may include patterns (or designs) that define alignment marks (also referred to as fiducial marks). The mask frame region 30 borders the mask image region 20, and in some embodiments, the mask frame region 30 surrounds the mask image region 20, defining the mask image region 20 of the mask 100. The mask 10 further includes a mask black border region 32, which is an area of the mask 10 outside the mask image region 20 that is exposed during an exposure process. In some embodiments, the mask black border region 32 is a portion of the mask frame region 30 that is adjacent to the mask image region 20.

In some embodiments, where the mask 10 is a phase shift mask, the mask 10 includes absorptive regions (for example, the regions formed by an absorption layer 124), which absorb light incident thereon, and reflective regions (for example, the regions formed by a reflective multilayer coating 120), which reflect light incident thereon. The absorptive regions can be configured to reflect light incident thereon with a phase different than light reflected by the reflective regions, such that resolution and image quality of the pattern transferred to a wafer such as a wafer 40 of FIG. 5 can be enhanced. The reflective and absorptive regions of the mask 10 are patterned such that light reflected from the reflective regions (and, in some cases, the absorptive regions) projects onto the wafer and transfers the pattern of the mask image region 20 to the wafer.

In some embodiments, as shown in FIG. 1B, the mask 10 includes a substrate 110, a reflective multilayer coating 120, an absorption layer 124 and the absorption part 128. The substrate 110 has a surface 112 and a surface 114 that is opposite the surface 112. The substrate 110 includes a low thermal expansion material (LTEM), such as quartz or glass. In an example, the LTEM substrate is a $SiO_2$—$TiO_2$-based glass substrate. The reflective multilayer coating 120 is disposed over the substrate 110, particularly over the surface 112 of the substrate 110. The reflective multilayer coating 120 (also referred to as a multilayer mirror (MLM)) includes a number of material layer/film pairs, where each pair includes at least two material layers having different refractive indices. A typical number of film pairs is about twenty to about eighty pairs, however, the reflective multilayer coating 120 may have any number of film pairs. The material of the at least two material layers is selected such that the reflective multilayer coating 120 exhibits high reflectivity to a particular radiation type/wavelength. In some embodiments, the reflective multilayer coating 120 includes material layer pairs that exhibit high reflectivity to EUV radiation. For example, the reflective multilayer coating 120 includes molybdenum-silicon (Mo/Si) film pairs (in other words, each pair includes a molybdenum layer disposed above or below a silicon layer). In an example, the reflective multilayer coating 120 includes forty Mo/Si film pairs. Alternatively, the reflective multilayer coating 120 includes molybdenum-beryllium (Mo/Be) film pairs, or any other combination of material film pairs that exhibit high reflectivity at EUV wavelengths. A thickness of the reflective multilayer coating 120 may be adjusted to achieve maximum constructive interference of the EUV radiation reflected at each interface of the film pairs while achieving a minimum absorption of the EUV radiation by the reflective multilayer coating 120. A thickness of each layer of the reflective multilayer coating 120 is determined based on the type of EUV radiation and incident angle of the EUV radiation projected onto the mask 10. In some embodiments, each of the molybdenum layers and the silicon layers of the Mo/Si film pairs have a thickness of about 4 nm to about 7 nm. In some embodiments, the reflective multilayer coating 120 has a thickness of about 210 nm to about 350 nm.

The absorption layer 124 is disposed over the buffer layer 122. The absorption layer 124 includes one or more layers designed to absorb radiation in the radiation type/wavelength range projected onto the mask 10. In some embodiments, the one or more layers of the absorption layer 124 are designed to absorb EUV radiation. The one or more layers include various materials, such as tantalum-containing materials (for example, Ta, TaN, TaNH, TaHF, TaHfN, TaBSi, TaB SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing material, or combinations thereof), titanium-containing materials (for example, Ti, TiN, other titanium-containing material, or combinations thereof), other suitable materials, or combinations thereof. A configuration of the one or more layers (such as material composition of the one or more layers) is selected to provide process flexibility during fabrication of the mask 10. For example, etching characteristics of the one or more layers of the absorption layer 124 provide process flexibility, which can reduce manufacturing time and costs. In some embodiments, the absorption layer 124 has a thickness of about 2 nm to about 5 nm.

The absorption layer 124 is patterned, such that a portion of the absorption layer 124 is disposed in the mask image region 20, and a portion of the absorption layer 124 is disposed in the mask frame region 30. The portion of the absorption layer 124 in the mask image region 20 defines the pattern (or design) of the layer of the integrated circuit device (or chip) in the mask image region 20 of the mask 10, and the portion of the absorption layer 124 in the mask frame region 30 may define the pattern of alignment marks in the mask frame region 30 of the mask 10.

In some embodiments, a buffer layer 122 is further disposed between the reflective multilayer coating 120 and the absorption layer 124. The buffer layer 122 is disposed over the reflective multilayer coating 120. The buffer layer 122 includes a material that protects the reflective multilayer coating 120 during processing of the mask 10 (for example, during etching of the absorption layer 124 of the mask 10). In some embodiments, the buffer layer 122 includes a ruthenium-containing material, such as Ru, RuNb, RuZr, RuMo, RuY, RuB, RuTi, RuLa, other ruthenium-containing material, or combinations thereof. Alternatively, the buffer layer 122 includes a chromium-containing material, such as Cr, CrN, CrO, CrC, CrON, CrCN, CrOC, CrOCN, other chromium-containing material, or combinations thereof. In yet another alternative, the buffer layer 122 includes materials other than ruthenium-containing materials and chromium-containing materials. The buffer layer 122 may include a combination of ruthenium-containing material, chromium-containing material, and other material, for example, where the buffer layer 122 includes multiple layers. In some embodiments, the buffer layer 122 has a thickness of about 2 nm to about 5 nm. It is noted that, in alternative embodiments, the buffer layer 122 may be a single layer.

In some alternative embodiments, a capping layer (not shown) may be disposed over the reflective multilayer coating 120 and between the reflective multilayer coating 120 and the buffer layer 122. The capping layer includes a silicon-containing material, such as silicon. In an example, the capping layer is a silicon layer of a topmost Mo/Si film pair of the reflective multilayer coating 120. The capping layer can prevent oxidation of the reflective multilayer coating 120, for example, during processing of the mask 10. The capping layer may thus include a material, other than a silicon-containing material, that prevents oxidation of the reflective multilayer coating 120. In an example, the capping layer has a thickness of about 4 nm to about 7 nm. In some alternative embodiments (not shown), a conductive layer may be disposed over the substrate 110, particularly over the surface 114 of the substrate 110. The conductive layer includes a material that facilitates electrostatic chucking. For example, the conductive layer includes a chromium-containing material, such as Cr, CrN, CrO, CrC, CrON, CrCN, CrOC, CrOCN, other chromium-containing materials, or combinations thereof. In some embodiments, the conductive layer is a CrN layer. In an example, the conductive layer has a thickness of about 10 nm to about 30 nm.

The absorption part 128 is disposed in a trench 126 of the reflective multilayer coating 120 and the absorption layer 124 in the mask black border region 32 adjacent to the mask image region 20 of the mask 10. In some embodiments, the absorption part 128 is disposed in the trench 126 of the reflective multilayer coating 120, the buffer layer 122, and the absorption layer 124. In some embodiments, the absorption part 128 penetrates the reflective multilayer coating 120, the buffer layer 122, and the absorption layer 124. In some embodiments, the absorption part 128 is frame-shaped and surrounds the mask image region 20. In some embodiments, a width of the trench 126 ranges from 2 mm to 3 mm, and a depth of the trench 126 is larger than 300 nm, for example. An extinction coefficient of the absorption part 128 is at least higher than an extinction coefficient of the reflective multilayer coating 120. The absorption part 128 includes metal, oxide thereof, nitride thereof or a combination thereof. In some embodiments, the metal has an extinction coefficient larger than 0.04 measured at about 13.5 nm of a light source, such as tin (Sn), nickel (Ni), cobalt (Co), iron (Fe) or a combination thereof. The absorption part 128 includes a plurality of nanoparticles (or nanospheres). That is, the absorption part 128 may include metal nanoparticles, metal oxide nanoparticles, metal nitride nanoparticles or a combination thereof. A diameter of the nanoparticles is less than or equal to 100 nm, for example. Since the absorption part 128 includes nanoparticles which have good gap-filling ability, and the absorption part 128 may be densely filled in the trench 126 to provide a desired reflectance. In an example, a top surface of the absorption part 128 may be substantially flush with a top surface of the absorption layer 124.

In some embodiments, the absorption part 128 reduces reflectivity of the mask black border region 32 of the mask 10, thereby reducing the amount of exposure experienced in adjacent fields 42, particularly at edges 42a of adjacent fields 42 and corners 42b of adjacent fields 42. Such reduction in light leakage enhances a resulting aerial image contrast realized by the mask 10 during integrated circuit device fabrication. In other words, the absorption part 128 minimizes reflectivity of the mask black border region 32 of the mask 10, which can reduce shadowing effects and mask black border effects while enhancing printability of the mask 10. In some embodiments, reflectivity of the mask black border region 32 of the mask 10 is minimized to reduce unwanted exposure. In some embodiments, a reflectivity at the mask black border region 32 of the mask 10 is less than or equal to about 0.3%, particularly less than or equal to about 0.05%, for example.

Figure 2:
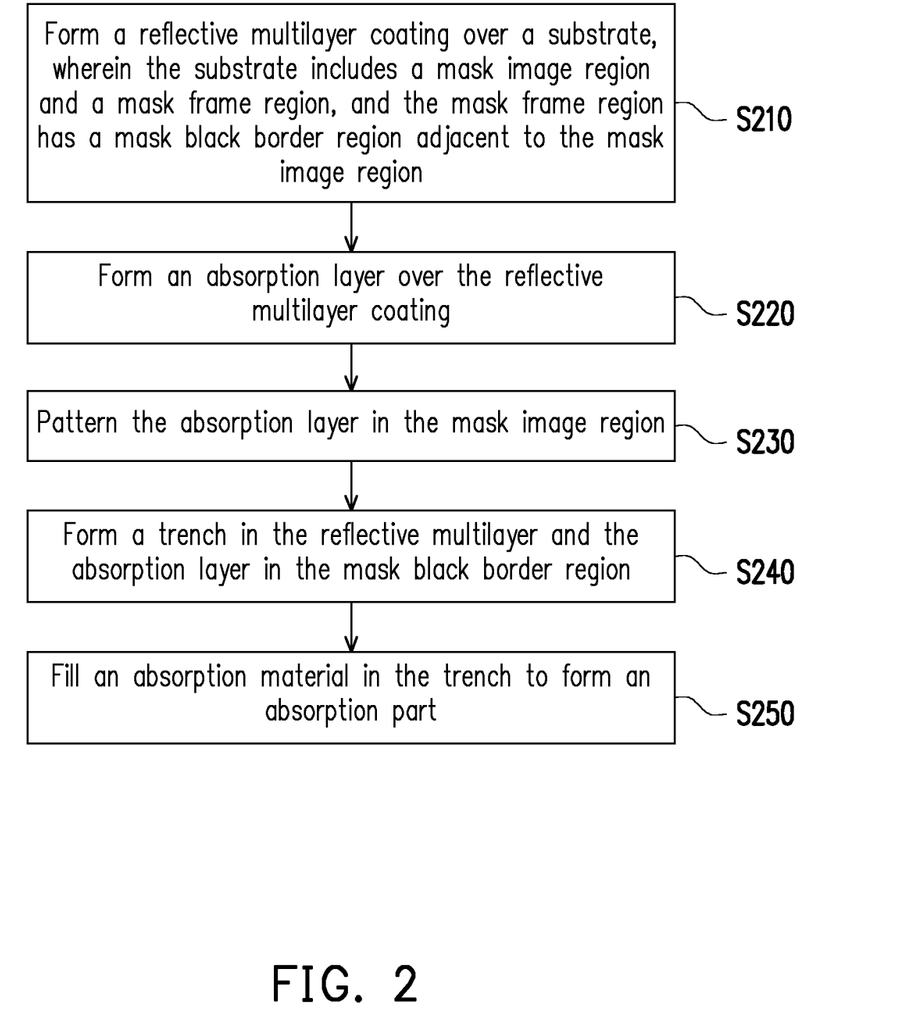
FIG. 2 is a flow chart of a method of fabricating a mask in accordance with some embodiments of the disclosure.
Figure 3A:
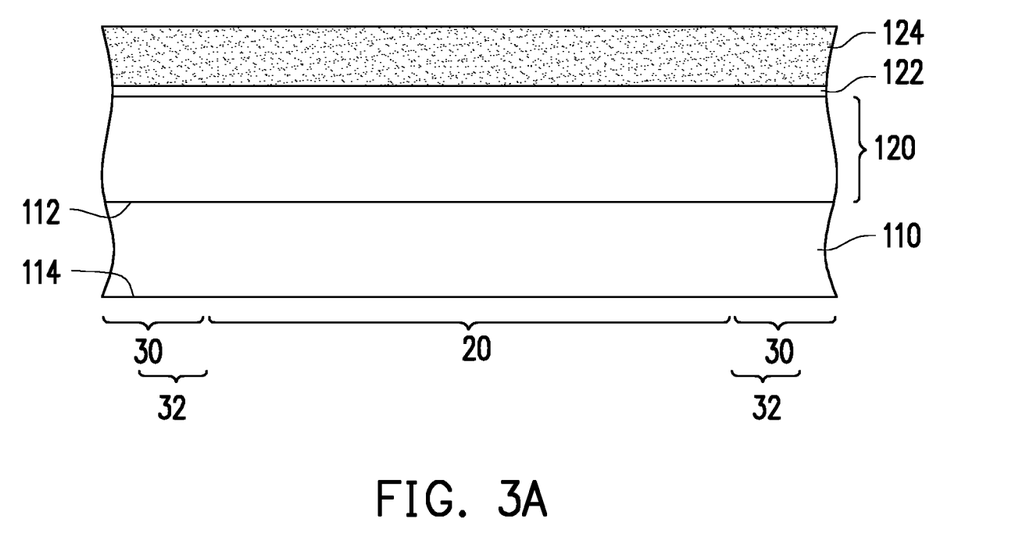
FIGS. 3A-3E are schematic cross-sectional views illustrating a method of fabricating a mask in accordance with some embodiments of the disclosure.

FIG. 2 is a flow chart of a method of fabricating a mask in accordance with some embodiments of the disclosure. FIGS. 3A-3E are schematic cross-sectional views illustrating a method of fabricating a mask in accordance with some embodiments of the disclosure. Referring to FIGS. 2 and 3A, at step S210, a reflective multilayer coating 120 is formed over a substrate 110, wherein the substrate 110 includes a mask image region 20 and a mask frame region 30, and the mask frame region 30 has a mask black border region 32 adjacent to the mask image region 20. In some embodiments, the reflective multilayer coating 120 is formed on a surface 112 of the substrate 110, and a buffer layer 122 is formed on the reflective multilayer coating 120. Then, at step S220, an absorption layer 124 is formed over the reflective multilayer coating 120. In some embodiments, the absorption layer 124 is formed on the buffer layer 122. In some embodiments, the reflective multilayer coating 120, the capping layer 122 and the absorption layer 124 may be formed by various methods, including physical vapor deposition (PVD) processes (for example, evaporation and DC magnetron sputtering), plating processes (for example, electrodeless plating or electroplating), chemical vapor deposition (CVD) processes (for example, atmospheric pressure CVD (APCVD), low pressure CVD (LPCVD), plasma enhanced CVD (PECVD), or high density plasma CVD (HDPCVD)), ion beam deposition, spin-on coating, metal-organic decomposition (MOD), other suitable methods, or combinations thereof.

Figure 3B:
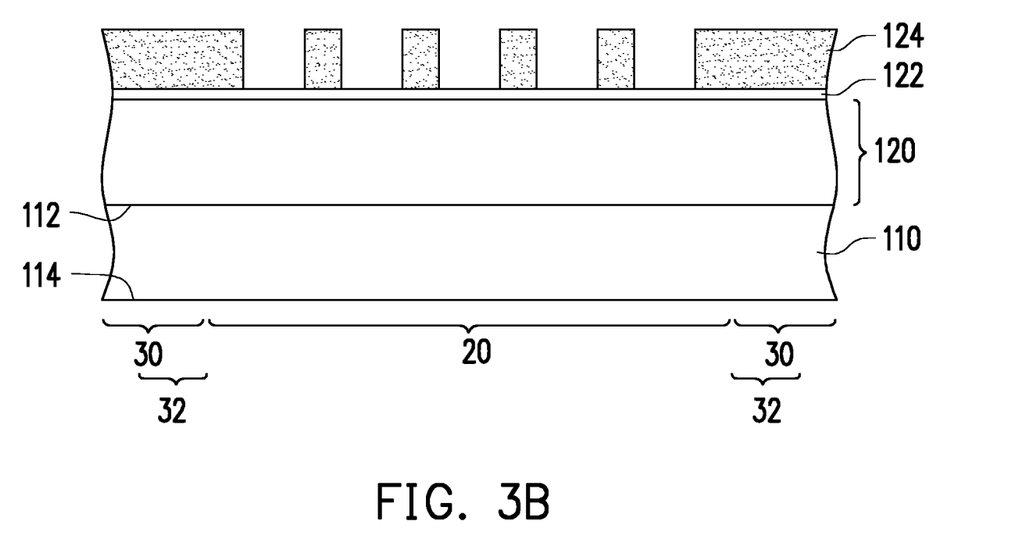

Referring to FIGS. 2 and 3B, at step S230, the absorption layer 124 is patterned in the mask image region 20. In some embodiments, by using a patterned photoresist layer, portions of the absorption layer 124 in the mask image region 20 are removed, and a pattern (or design) of a layer of an integrated circuit device is formed in the absorption layer 124 in the mask image region 20.

Figure 3C:
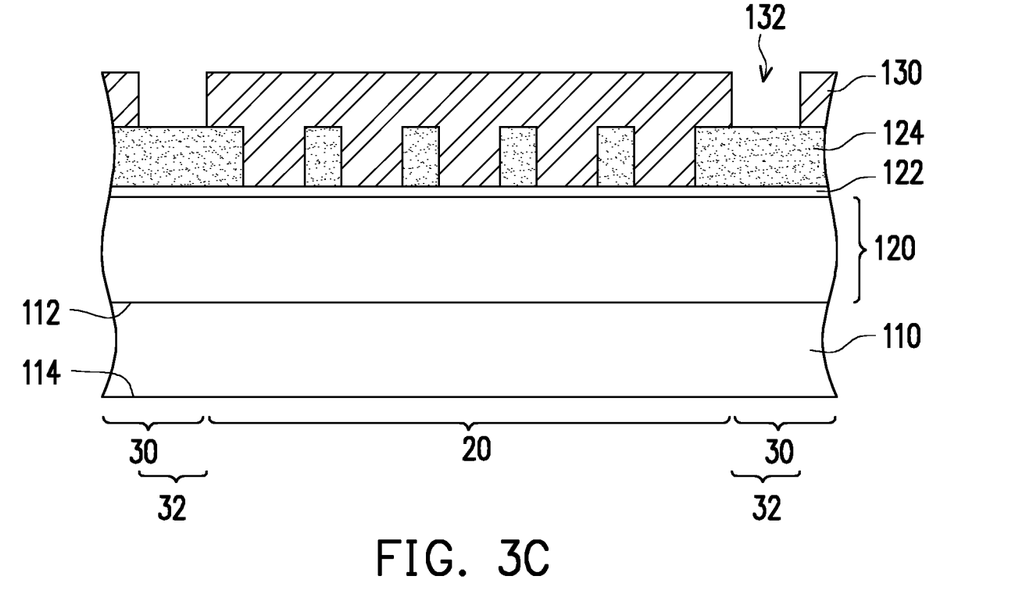
Figure 3D:
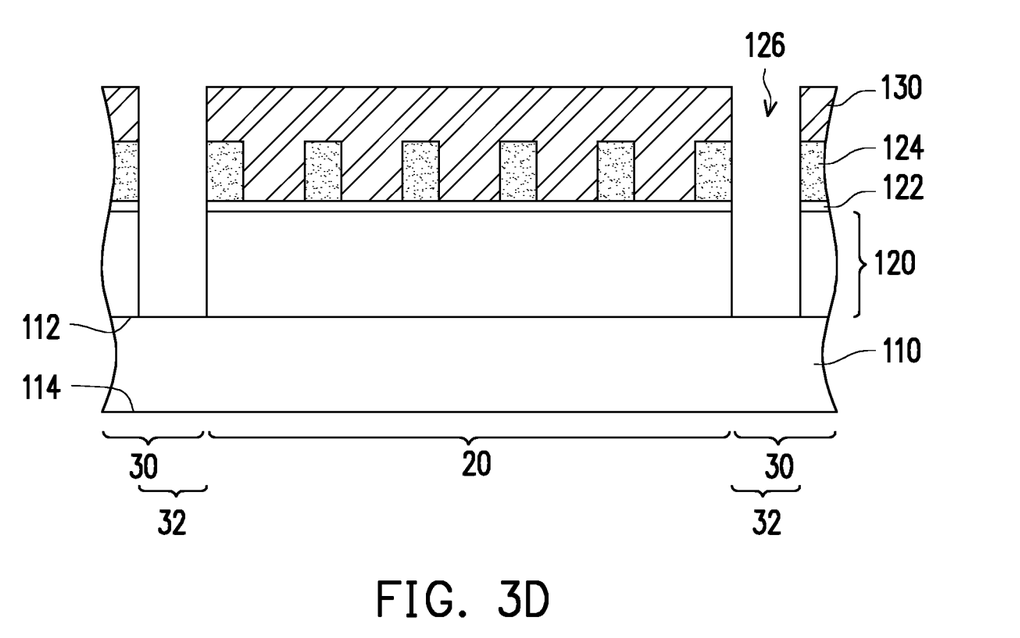

Referring to FIGS. 2, 3C and 3D, at step S240, a trench 126 is formed in the reflective multilayer 120 and the absorption layer 124 in the mask black border region 32. In some embodiments, as shown in FIG. 3C, a patterned photoresist layer 130 is formed over the patterned absorption layer 124. Openings 132 within the patterned photoresist layer 130 expose portions of the absorption layer 124 in the mask black border region 32 of the mask 10. The patterned photoresist layer 130 is a radiation-sensitive photoresist layer (also referred to as a photoresist layer, photosensitive layer, patterning layer, imaging layer, and light sensitive layer) that is responsive to an exposure process. The patterned photoresist layer 130 includes a positive-type resist material or a negative-type resist material, and may have a multi-layer structure. The patterned photoresist layer 130 is formed by any suitable method. In some embodiments, a photoresist layer is deposited over the patterned absorption layer 124, for example, by a spin-on coating process; exposed to an electron beam (electron beam (e-beam) lithography); and developed such that either exposed or unexposed portions of the photoresist layer remain to form the patterned photoresist layer 130. Such process may include a baking process (such as a post-exposure baking process and/or a pre-exposure baking process), a rinsing process, other suitable process, or combinations thereof. Alternatively, the patterned photoresist layer 130 is formed by exposing the photoresist layer to radiation using a mask. In yet another alternative, the patterned photoresist layer 130 is formed by exposing the photoresist layer to an ion-beam or other suitable method Then, as shown in FIG. 3D, by using the patterned photoresist layer 130 as a mask, portions of the reflective multilayer 120, the buffer layer 122, and the absorption layer 124 are removed to form the trench 126, which exposes the substrate 110. In some embodiments, the trench 126 is formed in the mask black border region 32 adjacent to the mask image region 20. The trench 126 is entirely disposed in the mask black border region 32 and surrounds the mask image region 20, for example. In some embodiments, the exposed portions of the absorption layer 124, the buffer layer 122 and the reflective multilayer 120 in the mask black border region 32 of the mask 300 are sequentially removed by different etching processes. In some embodiments, imperfect etching profile such as undercut, residue defect and/or taper profile may be occurred. For example, in some alternative embodiments, a sidewall of the trench 126 in the reflective multilayer 120 and a sidewall of the trench 126 in the absorption layer 124 may be not aligned, or residue of at least one of the reflective multilayer 120 and the absorption layer 124 may be disposed in the trench 126.

In some embodiments, the etching process includes a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters. In some embodiments, the etching process for the absorption layer 124 is a dry etching process. For example, the etching process uses a fluorine-containing gas (such as $CHF_3$, $CF_4$, and $C_2F_6$, other fluorine-containing gas, or combinations thereof) and a chlorine-containing gas (such as $Cl_2$, $SiCl_4$, HCl, $CCl_4$, $CHCl_3$, other chlorine-containing gas, or combinations thereof). In an example, the etching process uses a mixture of $CHF_3$ and $CF_4$, the process chamber pressure is 0.5 to 1.5 mTorr, the plasma source power ($W_s$) is 350 to 450 W, and the substrate bias power ($W_b$) is 50 to 150 W. In an example, the etching process uses a mixture of $Cl_2$ and Ar, the process chamber pressure is 1.5 to 2.5 mTorr, the plasma source power ($W_s$) is 75 to 125 W, and the substrate bias power ($W_b$) is 20 to 30 W. In some embodiments, the etching process for the buffer layer 122 is a dry etching process. For example, the etching process uses a fluorine-containing gas (such as $CHF_3$, $CF_4$, and $C_2F_6$, other fluorine-containing gas, or combinations thereof) or an oxygen-containing gas (such as $O_2$, other oxygen-containing gas, or combinations thereof). In an example, the etching process uses a mixture of $CHF_3$ and Ar, the process chamber pressure is 3 to 4 mTorr, the plasma source power ($W_s$) is 350 to 450 W, and the substrate bias power ($W_b$) is 50 to 125 W. In an example, the etching process uses a mixture of $Cl_2$ and $O_2$, the process chamber pressure is 3 to 4 mTorr, the plasma source power ($W_s$) is 700 to 900 W, and the substrate bias power ($W_b$) is 50 to 70 W. In some embodiments, the etching process for the reflective multilayer 120 is a dry etching process. For example, the etching process uses a fluorine-containing gas (such as $CHF_3$, $CF_4$, and $C_2F_6$, other fluorine-containing gas, or combinations thereof) and an oxygen-containing gas (such as $O_2$, other oxygen-containing gas, or combinations thereof). In an example, the etching process uses a mixture of $Cl_2$, $O_2$, He and $N_2$, the process chamber pressure is 3 to 5 mTorr, the plasma source power ($W_s$) is 700 to 900 W, and the substrate bias power ($W_b$) is 50 to 70 W.

Figure 3E:
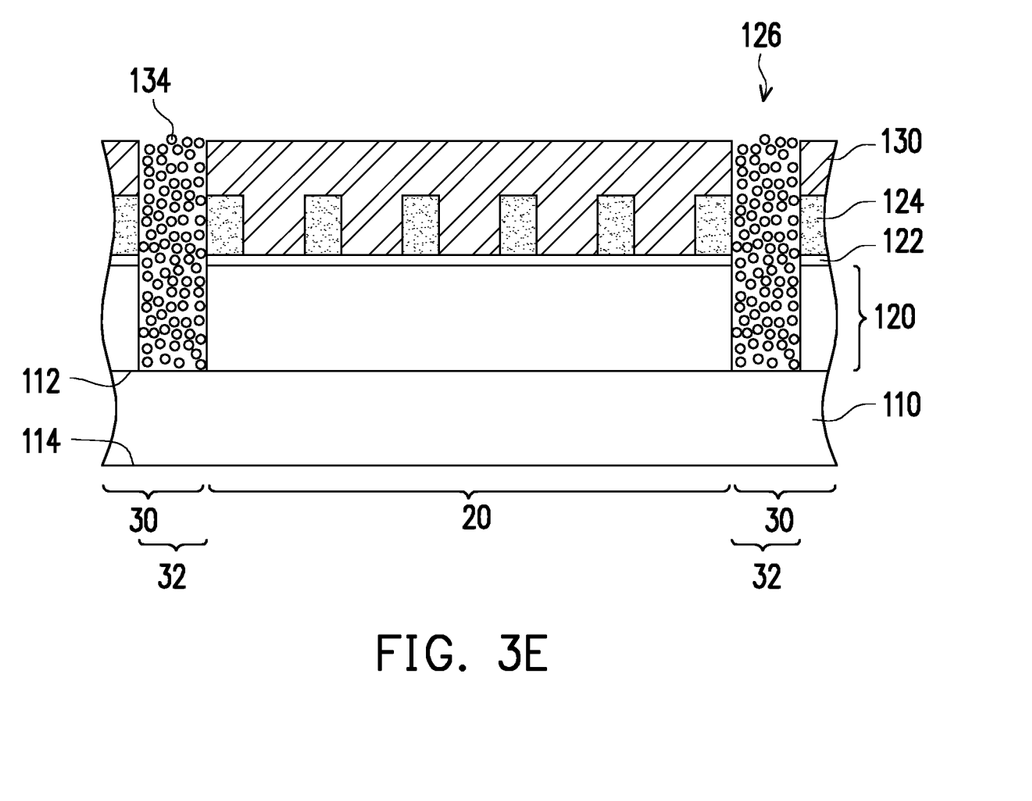

Referring to FIGS. 2 and 3E, at step S250, an absorption material 134 is filled in the trench 126, so to form an absorption part 128 of FIGS. 1A and 1B. In some embodiments, the absorption material 134 is formed by a coating process such as a spin-coating process, for example. In an example, a solvent is provided, and then nanoparticles of the absorption material 134 are dispersed in the solvent, so as to form a mixture. In some embodiments, the solvent may be any solvent which does not react with the nanoparticles of the absorption material 134, has good coatability and may be easily removed by spinning. Then, with gradually increasing rotational speed such as ranging from 500 to 3000 rpm, the mixture is coated over the substrate 110 to fill the absorption material 134 in the trench 126, and then the solvent is removed. In some embodiments, a thickness of the coating may be controlled by the rotational speed. In some embodiments, the absorption material 134 not only fills up the trench 126 in the reflective multilayer 120, the buffer layer 122 and the absorption layer 124 but also fills up the opening 132 within the photoresist layer 130.

Then, the photoresist layer 130 is removed, and the absorption part 128 and thus the mask 10 of FIGS. 1A and 1B are formed. In some embodiments, the photoresist layer 130 is removed by a wet stripping, plasma ashing, or other known or to-be-developed technique. During the removal process for the photoresist layer 130, a portion of the absorption material 134 outside the trench 126 may be also removed, such as a portion of the absorption material 134 filled in the opening 132 within the photoresist layer 130. In other words, additional process for removing the absorption material 134 outside the trench 126 is omitted. In some embodiments, as shown in FIG. 1B, a top surface of the photoresist layer 130 is substantially flush with a top surface of the absorption part 128, for example.

Figure 4:
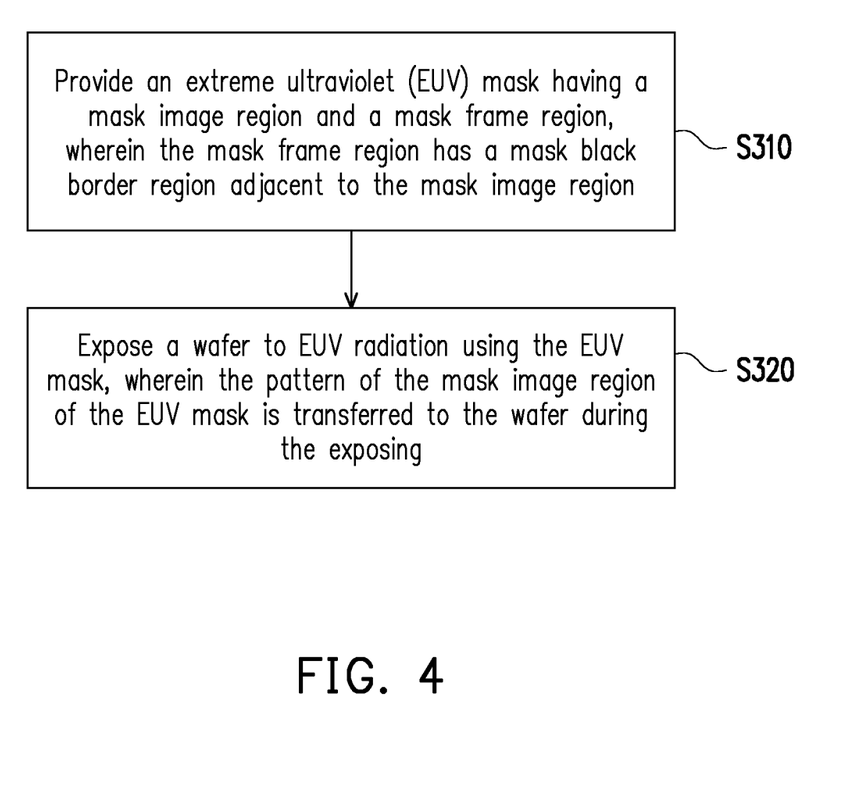
FIG. 4 is a flow chart of a method of fabricating a mask in accordance with some embodiments of the disclosure.
Figure 5:
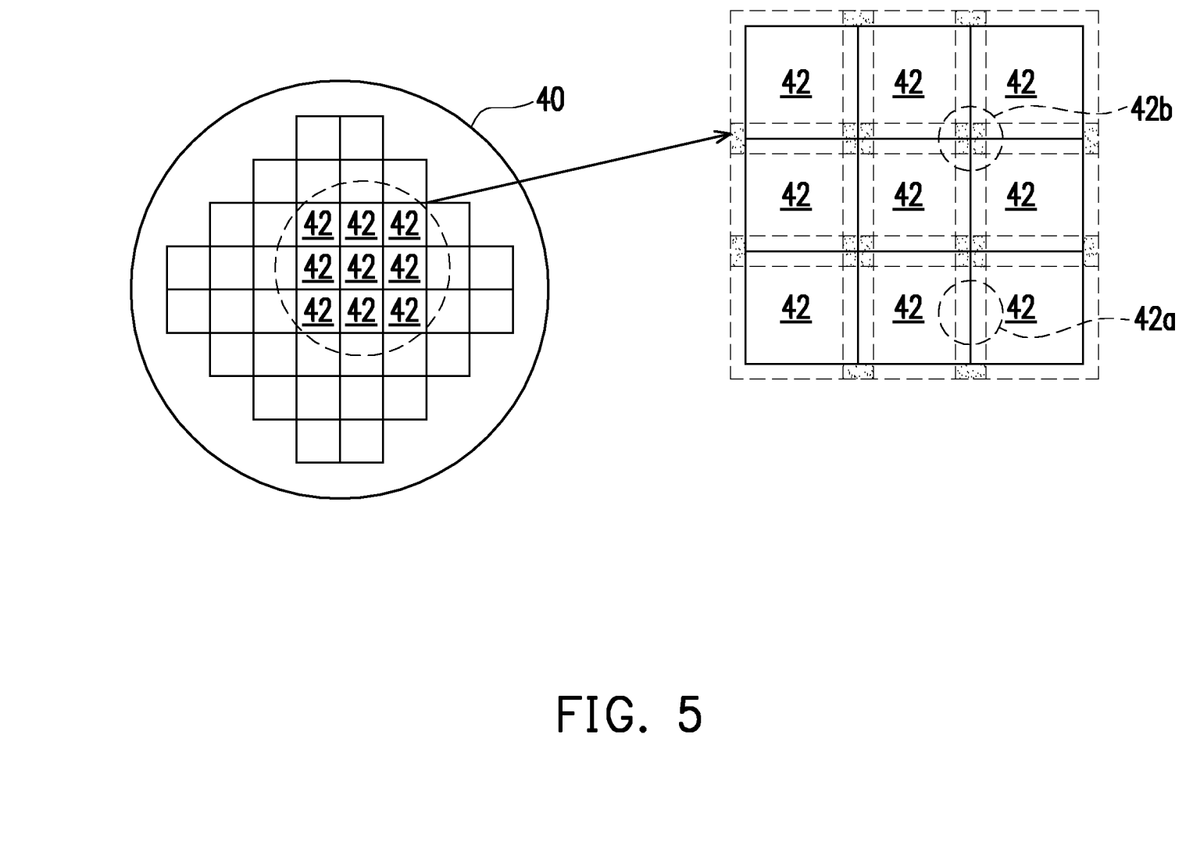
FIG. 5 is a top schematic view of a wafer that is exposed using the mask of FIGS. 1A and 1B in accordance with some embodiments of the disclosure.

FIG. 4 is a flow chart of a method of fabricating a mask in accordance with some embodiments of the disclosure. FIG. 5 is a top schematic view of a wafer that is exposed using the mask of FIGS. 1A and 1B in accordance with some embodiments of the disclosure. Referring to FIGS. 1A, 1B and 4, at step S310, an extreme ultraviolet (EUV) mask 10 having a mask image region 20 and a mask frame region 30 is provided, wherein the mask frame region 30 has a mask black border region 32 adjacent to the mask image region 20, the mask image region 20 of the EUV mask 10 includes a pattern of an integrated circuit device (as shown in FIG. 1B). In some embodiments, details of the extreme ultraviolet (EUV) mask 10 are described above, and thus are omitted.

Referring to FIGS. 1A, 1B, 4 and 5, at step S320, a wafer 40 is exposed to EUV radiation using the EUV mask 10, wherein the pattern of the mask image region 20 of the EUV mask 10 is transferred to the wafer 40 during the exposing. In some embodiments, a photoresist layer (not shown) is formed on a material layer of the wafer 40, and a portion of the photoresist layer is exposed by the EUV mask 10. Then, the EUV radiation and a development process are sequentially performed on the photoresist layer. After that, an etching process is performed to remove the portion of the photoresist layer if the photoresist layer is a positive photoresist, and thus the underlying material layer is partially exposed by the photoresist layer. Then, an etching process is performed on the material layer by using the patterned photoresist layer as a mask, to form a patterned material layer having a pattern. In other words, during the exposure process, light (radiation) is projected onto the mask 10, and a portion of the light is transmitted to the photoresist layer on the wafer 40, thereby transferring the pattern of the mask image region 20 to the photoresist layer on the wafer 40. Then, the pattern of the photoresist layer is transferred to the material layer of the wafer 40. In an example, the EUV radiation has a wavelength of about 1 nm to about 100 nm. The mask image region 20 can be transferred to the wafer 40 multiple times using multiple exposures with the mask 10. For example, in FIG. 2, the mask 10 is used in multiple exposure processes to pattern the wafer 40, such that the pattern of the mask image region 20 is transferred to various fields 42 of the wafer 40. Each field 42 corresponds to at least one semiconductor device (or at least one integrated circuit device) and represents an area of the wafer 40 that will be processed at a given time. For example, an exposure tool (such as a stepper or a scanner) processes one field (such as exposing a field 42 of the wafer 40 to the mask 10), then processes the next field (such as exposing another field 42 of the wafer 40 to the mask 10), and so on. In some embodiments, the wafer 40 includes a photoresist layer disposed over a substrate, where the pattern of the mask image region 20 is transferred to the photoresist layer.

Conventionally, during the exposure process of each field 42, exposure light may leak to adjacent fields 42, particularly at edges 42a and corners 42b of the fields 42. Such light leakage can be attributed to light diffraction phenomenon, positional accuracy of the mask 10 with respect to the wafer 40, positional accuracy of the mask 10 with respect to the exposure tool, other phenomena, or combinations thereof. Light leakage may result from positional accuracy of the mask 10 with respect to the exposure tool, such as the stepper or the scanner. For example, for each exposure process, the exposure tool defines a portion of the mask 10 for exposing light thereon. An exposure slit of the exposure tool (defined by blades of the exposure tool, in an example) may define the portion of the mask 10 that will be exposed to the light. Ideally, the light exposes the mask image region 20 of the mask 10. Typically, however, the exposure slit will expose an area of the mask 10 outside the mask image region 20. Generally, the mask black border region 32 of the mask 10 represents an area of the mask 10 that is outside the mask image region 20 and will be exposed to the light (in other words, an area of the mask 10 outside the mask image region that is not covered by the exposure tool). If the mask black border region 32 of the mask 10 is exposed to light during the exposure process, the mask black border region 32 undesirably transmits a portion of light to the wafer 40, resulting in edges 42a of the fields 42 receiving double exposure and corners 42b of the fields 42 receiving quadruple exposure. However, in some embodiments, by disposing an absorption part 128 in the mask black border region 32, the mask 10 reduces reflectivity of the mask black border region 32, thereby reducing the amount of exposure experienced in adjacent fields 42, particularly at edges of adjacent fields 42 and corners of adjacent fields 42. Such reduction in light leakage enhances a resulting aerial image contrast realized by the mask 10 during integrated circuit device fabrication.

In some embodiments, the absorption part is formed in the trench in the mask black border region of the mask, to minimize reflectivity of light at the mask black border region of the mask. Therefore, the impact on the critical dimension (CD) nearby the image border (edge) due to the unwanted exposure may be also minimized. In addition, since the trench is filled with the absorption material, the imperfect etching profile such as undercut, residue defect and/or taper profile would be acceptable. Thus, the concern to the trench profile and defect in the trench may be not required. Furthermore, the formation of the absorption part is compatible with the current reticle process flow. In some embodiments, the absorption part includes metallic nanoparticles with good electrical conduction and may be used to reduce surface charge effect, and thus the bridges for reducing electrostatic discharging (ESD) are not necessary and the complicated design thereof is omitted. Accordingly, cost and time for forming the mask can be significant reduced, and the quality of the mask can be improved.

In accordance with some embodiments of the disclosure, a mask includes a substrate, a reflective multilayer coating, an absorption layer and an absorption part. The substrate includes a mask image region and a mask frame region, wherein the mask frame region has a mask black border region adjacent to the mask image region. The reflective multilayer coating is disposed over the substrate. The absorption layer is disposed over the reflective multilayer coating. The absorption part is disposed in the reflective multilayer and the absorption layer in the mask black border region.

In accordance with alternative embodiments of the disclosure, a method of forming a mask includes the following steps. A reflective multilayer coating is formed over a substrate, wherein the substrate comprises a mask image region and a mask frame region, and the mask frame region has a mask black border region adjacent to the mask image region. An absorption layer is formed over the reflective multilayer coating. The absorption layer is patterned in the mask image region. A trench is formed in the reflective multilayer and the absorption layer in the mask black border region. An absorption material is filled in the trench to form an absorption part.

In accordance with yet alternative embodiments of the disclosure, a method of manufacturing a semiconductor device includes the following steps. An extreme ultraviolet (EUV) mask is provided, the mask has a mask image region and a mask frame region, and the mask frame region has a mask black border region adjacent to the mask image region, the mask image region of the EUV mask includes a pattern of an integrated circuit device. The EUV mask includes a substrate, a reflective multilayer coating, an absorption layer and an absorption part. The reflective multilayer coating is disposed over the substrate. The absorption layer is disposed over the reflective multilayer coating. The absorption part is disposed in the reflective multilayer and the absorption layer in the mask black border region. A wafer is exposed to EUV radiation using the EUV mask, wherein the pattern of the mask image region of the EUV mask is transferred to the wafer during the exposing.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A mask, comprising:
a substrate comprising a mask image region and a mask frame region, wherein the mask frame region has a mask black border region adjacent to the mask image region;
a reflective multilayer coating disposed over the substrate;
an absorption layer disposed over the reflective multilayer coating, comprising a first portion in the mask image region and a second portion in the mask frame region; and
an absorption part, disposed in the reflective multilayer and the absorption layer and in the mask black border region, wherein an entire top surface of the absorption part is continuously extended between a top surface of the first portion and a top surface of the second portion, the entire top surface of the absorption part is substantially flush with the top surface of the first portion and the top surface of the second portion.

2. The mask of claim 1, wherein the absorption part comprises at least one of metal oxide, metal nitride or a combination thereof.

3. The mask of claim 1, wherein the absorption part has an extinction coefficient larger than 0.04.

4. The mask of claim 1, wherein the absorption part comprises tin (Sn), nickel (Ni), cobalt (Co), iron (Fe) or a combination thereof.

5. The mask of claim 1, further comprising a ruthenium-containing buffer layer disposed between the reflective multilayer coating and the absorption layer, wherein the absorption part is further disposed in the ruthenium-containing buffer layer.

6. The mask of claim 1, wherein the absorption part is frame-shaped.

7. The mask of claim 1, wherein the absorption part penetrates through the reflective multilayer and the absorption layer.

8. The mask of claim 1, wherein the absorption part is in contact with the first portion, the second portion and portions of the reflective multilayer coating.

9. A method of forming a mask, comprising:
forming a reflective multilayer coating over a substrate, wherein the substrate comprises a mask image region and a mask frame region, and the mask frame region has a mask black border region adjacent to the mask image region;
forming an absorption layer over the reflective multilayer coating;
patterning the absorption layer in the mask image region;
forming a trench in the reflective multilayer and the absorption layer in the mask black border region, wherein a first portion of the absorption layer in the mask image region and a second portion of the absorption layer in the mask frame region are separated by the trench; and
filling an absorption material in the trench to form an absorption part, wherein an entire top surface of the absorption part is continuously extended between a top surface of the first portion and a top surface of the second portion, and the entire top surface of the absorption part is substantially flush with the top surface of the first portion and the top surface of the second portion.

10. The method of claim 9, wherein the absorption material has an extinction coefficient larger than 0.04.

11. The method of claim 9, wherein the absorption material comprises conductive nanoparticles, conductive nanospheres or a combination thereof.

12. The method of claim 9, further comprising forming a ruthenium-containing buffer layer between the reflective multilayer coating and the absorption layer, wherein the trench is further formed in the ruthenium-containing buffer layer.

13. The method of claim 9, wherein the step of forming the trench comprises:
forming a photoresist layer over the patterned absorption layer; and
using the photoresist layer as a mask, removing a portion of the patterned absorption layer and the reflective multilayer coating to form the trench.

14. The method of claim 13, further comprising removing portions of the absorption material outside the trench.

15. The method of claim 13, further comprising removing the photoresist layer and portions of the absorption material outside the trench by a resist stripping process.

16. The method of claim 9, wherein the substrate is exposed by the trench.

17. A method of manufacturing a semiconductor device, comprising:
providing an extreme ultraviolet (EUV) mask having a mask image region and a mask frame region, wherein the mask frame region has a mask black border region adjacent to the mask image region, the mask image region of the EUV mask includes a pattern of an integrated circuit device, and the EUV mask includes:
a substrate;
a reflective multilayer coating disposed over the substrate;
an absorption layer disposed over the reflective multilayer coating; and
an absorption part, disposed in the mask black border region and penetrating through the reflective multilayer and the absorption layer, wherein in a cross-sectional view, a width of a top surface of the absorption part is substantially the same as a width of a bottom surface of the absorption part; and
exposing a wafer to EUV radiation using the EUV mask, wherein the pattern of the mask image region of the EUV mask is transferred to the wafer during the exposing.

18. The method of claim 17, wherein the exposing includes transferring the pattern of the mask image region of the EUV mask to adjacent fields of the wafer.

19. The method of claim 17, wherein the absorption part has an extinction coefficient larger than 0.04.

20. The method of claim 17, wherein the absorption part comprises conductive nanoparticles.

* * * * *